(12) United States Patent
Dastidar et al.

(10) Patent No.: US 8,952,713 B1
(45) Date of Patent: Feb. 10, 2015

(54) METHOD AND APPARATUS FOR DIE TESTING

(75) Inventors: Jayabrata Ghosh Dastidar, Campbell, CA (US); Aman Aflaki Beni, San Jose, CA (US); Zunhang Yu Kasnavi, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 255 days.

(21) Appl. No.: 13/369,224

(22) Filed: Feb. 8, 2012

(51) Int. Cl.
*G01R 31/20* (2006.01)
(52) U.S. Cl.
USPC ............. 324/754.07; 324/754.01; 324/754.03
(58) Field of Classification Search
None
See application file for complete search history.

(56) References Cited

U.S. PATENT DOCUMENTS

| | | | | |
|---|---|---|---|---|
| 5,070,297 A | * | 12/1991 | Kwon et al. | 324/754.03 |
| 5,198,758 A | * | 3/1993 | Iknaian et al. | 714/724 |
| 5,430,400 A | * | 7/1995 | Herlein et al. | 327/108 |
| 6,232,790 B1 | * | 5/2001 | Bryan et al. | 324/754.07 |
| 7,319,341 B1 | * | 1/2008 | Harms et al. | 324/754.28 |
| 2004/0124829 A1 | * | 7/2004 | Swettlen et al. | 324/158.1 |
| 2005/0162176 A1 | * | 7/2005 | Bucksch | 324/754 |
| 2006/0082358 A1 | * | 4/2006 | Conner | 324/158.1 |

* cited by examiner

*Primary Examiner* — Melissa Koval
*Assistant Examiner* — Courtney McDonnough
(74) *Attorney, Agent, or Firm* — Womble, Carlyle, Sandridge & Rice, LLP

(57) ABSTRACT

A device tester is provided. The device tester includes a probe card and a substrate coupled to the probe card. The substrate has a plurality of layers for routing a signal. An integrated circuit is coupled to the substrate. The integrated circuit is operable to transmit an input signal received from a testing apparatus to a device under test through the substrate to a signal probe. The signal probe is further operable to receive a test signal from the device under test in response to the input signal, wherein the integrated circuit is operable to amplify the test signal, and transmit the amplified test signal to the testing apparatus.

17 Claims, 4 Drawing Sheets

METHOD AND APPARATUS FOR DIE TESTING

BACKGROUND

One of the stages in the manufacturing process of integrated circuit (IC) devices, such as flash memory, subjects each IC device located on the semiconductor wafer to various electrical tests, known as "wafer sort." This process evaluates the electronic functionality of each IC device by running analytical electrical tests prior to dicing the wafer and packaging the resulting individual chips. Devices identified as defective are repaired, if possible, while non-repairable devices are sorted out to increase the yield and reduce manufacturing cost. Testing generally involves an external testing apparatus that generates a set of predetermined electrical input signals that are supplied to each IC device to be tested through a multitude of signal probes located on a probe card. The signal probes measure the IC devices' characteristic responses to the input signals, which are then analyzed by the testing apparatus to identify defective IC devices.

With advances in low cost IC production and decreasing physical geometries, the power levels required to operate IC devices is decreasing. For example, stacked dies with small buffers are designed to operate mainly in cross-device communication mode within the same package, requiring very little power. Other devices may be designed without any input/output (IO) functionality. In such designs, the available power might be insufficient to drive electrical signals from the device to be tested through solder bumps or other interconnections to the probe card and/or an external testing apparatus located in the electrical path.

Thus, the inability to communicate with products operating at such low signal strength makes it difficult to test the IC with the current probe card configuration and testing apparatus.

SUMMARY

Broadly speaking, the embodiments fill these needs by providing a method and apparatus for amplifying a test signal from a device under test. It should be appreciated that the present invention can be implemented in numerous ways, such as a process, an apparatus, a system, a device or a method on a computer readable medium. Several inventive embodiments of the present invention are described below.

In one embodiment, a device tester is provided. The device tester includes a probe card and a substrate coupled to the probe card. The substrate has a plurality of layers for routing a signal. An integrated circuit is coupled to the substrate. The integrated circuit is operable to transmit an input signal received from a testing apparatus to a device under test through the substrate to a signal probe. The signal probe is further operable to receive a test signal from the device under test in response to the input signal, wherein the integrated circuit is operable to amplify the test signal, and transmit the amplified test signal to the testing apparatus.

In accordance with another exemplary embodiment, a device tester is provided. The device tester includes an integrated circuit disposed on a multi-layer semiconductor substrate. The integrated circuit is electrically coupled to a testing apparatus. The integrated circuit is configured to propagate electrical signals between the testing apparatus and a device under test, wherein the integrated circuit is operable to amplify a voltage level of a response received from the device under test. The response is generated from a test signal transmitted to the device under test through the integrated circuit.

In accordance with another exemplary embodiment, a method for testing a device under test is provided. The method includes receiving an input signal from a testing apparatus. The input signal is transmitted to a device under test through an integrated circuit. A response to the input signal from the device under test is received. A voltage level of the response is amplified through amplification circuitry of the integrated circuit and the amplified response is transmitted to the testing apparatus.

Other aspects and advantages of the embodiments will become apparent from the following detailed description, taken in conjunction with the accompanying drawings, illustrating by way of example the principles of the embodiments.

BRIEF DESCRIPTION OF THE DRAWINGS

The embodiments, together with further advantages thereof, may best be understood by reference to the following description taken in conjunction with the accompanying drawings.

DETAILED DESCRIPTION

The following embodiments describe exemplary apparatus and method for testing an integrated circuit having a stacked die configuration. It will be obvious, however, to one skilled in the art, that the embodiments may be practiced without some or all of these specific details. In other instances, well known process operations have not been described in detail in order not to unnecessarily obscure the embodiments.

The embodiments described below provide a signal amplification feature for a probe card used for on-wafer integrated circuit (IC) measurements. The signal amplification is accomplished by adding an active IC with input/output (I/O) capability onto the probe card. The signal amplification enables measurement of low power signals returned by a device under test (DUT) in response to a series of testing signals from an external testing apparatus. Through the amplification described below the signal received from the IC is boosted by the probe card in order to be accurately measured by the test equipment in communication with the probe card. The low drive strength signals associated with a stacked die configuration or a core die with mini-buffers designed to communicate to nearby dies through silicon vias (TSV) and micro bumps. The active IC with I/O capability may be embedded in the probe card and receives the response signals from the DUT that would normally be transmitted to the test equipment. The active IC with I/O capability amplifies the response signals prior to transmission to the test equipment. In one embodiment, the active IC with I/O capability includes an independent power source, e.g., from the testing apparatus. In another embodiment, the active IC with I/O capability includes a voltage level shifter to amplify the buffered, weak signals. Faster testing speeds are enabled by the embodiments described below as the testing apparatus can communicate at a relatively high rate, e.g., greater than 200 mega bits per second, to the IO die, and IO die can communicate at the relatively high rate to the DUT, where the relatively high data rate is not limited due to the signal strength. It should be appreciated that the embodiments may be extended to any chip having a design that results in a weak signal output, e.g., such as chips designed for a stacked die configuration or any chip having relatively small I/O buffers that communicate with an external chip through a microbump configuration.

Figure 1:
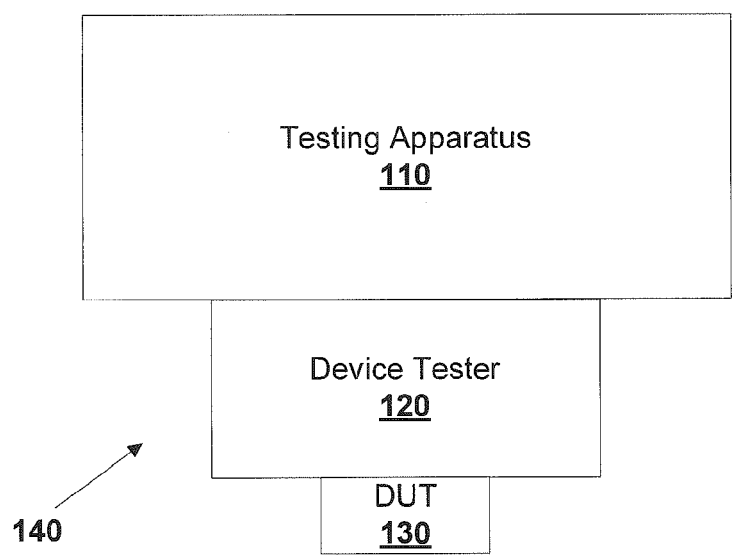
FIG. 1 is a schematic diagram illustrating a high level view of a test system according to one embodiment.

FIG. 1 is a schematic diagram illustrating a high level view of a test system according to one embodiment. Test system 140 includes testing apparatus 110, which is coupled to device tester 120. Device tester 120 is coupled to DUT 130. Testing apparatus 110 processes internal software instructions to perform a series of test procedures designed to evaluate the electrical functionality of DUT 130. Testing apparatus 110 gathers test data from DUT 130 and analyzes the gathered data for display of the results on a graphical user interface in one instance. The test results may also be stored for future processing. Device tester 120 is electrically coupled with DUT 130 through a multitude of signal probes attached to a probe card. Electrically conductive solder bumps or wire bonds disposed on the top surface of DUT 130 provide physical contact points in one embodiment. DUT 130 can be any electronic device, such as a die formed on a semiconductor wafer and the wafer may be mounted on a movable wafer chuck for aligning DUT 130 with a signal probe of device tester 120.

Device tester 120 includes circuitry for receiving input signals from testing apparatus 110 and transmitting input signals to DUT 130. The circuitry of device tester 120 is also capable of receiving a response from DUT 130 and transmitting the received response to testing apparatus 110. Device tester 120 is powered from an external source in one embodiment. One exemplary test performed through testing apparatus 110 on the dies of a wafer is an Automatic test pattern generation (ATPG) scan.

Once contact is established between device tester 120 and DUT 130, the testing apparatus 110 commences testing by transmitting electrical test input signals having a predetermined voltage or current pattern through device tester 120 to DUT 130. DUT 130 is stimulated through the input and the response to the input signals is captured by device tester 120 and amplified to a level suitable for readout by testing apparatus 110. Amplification at device tester 120 enables the testing of DUTs having a relatively low power signal response, which without amplification may not be strong enough for testing apparatus 110 to capture. Thus, for stacked dies and dies without I/O functionality the amplification provided through the embodiments described herein enables the testing to be executed. It should be appreciated that the test protocol run by testing apparatus 110 analyzes data contained in the amplified response and compares the received response to an expected response to identify defective DUTs. Typically each DUT is tested on-wafer prior to sorting out bad components and prior to dicing and packaging good components into individual chips.

Figure 2:
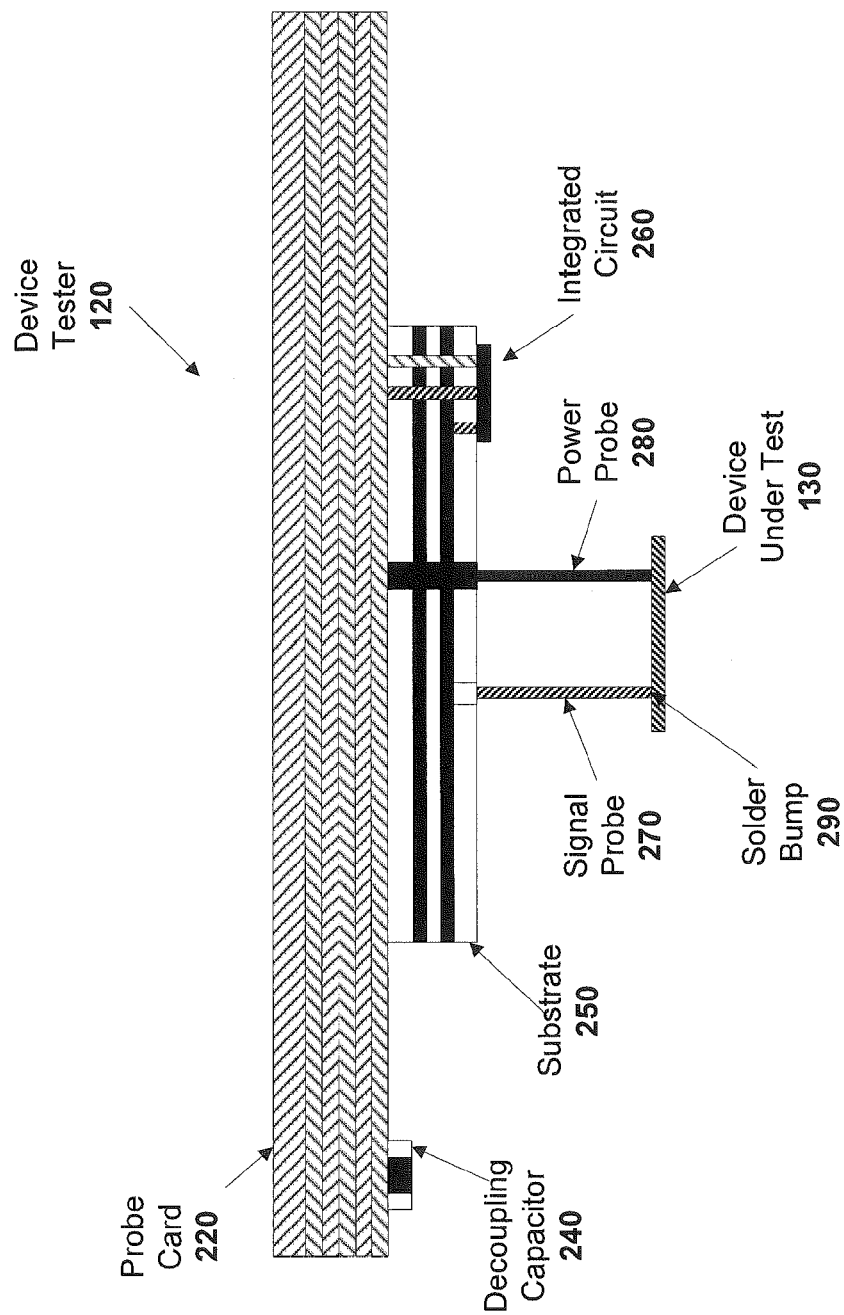
FIG. 2 is a schematic diagram of a cross-sectional view of a device tester according to one embodiment.

FIG. 2 is a schematic diagram of a cross-sectional view of a device tester according to one embodiment. Device tester 120 includes probe card 220 that is a multi-layer substrate of conductive and dielectric layers in one embodiment. Probe card 220 includes substrate 250 that may be a multi-layer organic (MLO) substrate formed from a resin as a base material, or a multi-layer ceramic (MLC) substrate having ceramics as a base material. Substrate 250 of probe card 220 is a multi-layer interconnection structure configured to route electrical signals and power between signal probe 270 and probe card 220. Signal probe 270 and power probe 280 extend from a surface of substrate 250 to a surface of DUT 130. Signal probe 270 provides test signals to DUT 130, e.g., from a device tester, and power probe 280 provides power to DUT 130. It should be appreciated that for multi-layered components such as substrate 250 and probe card 220, each layer may include electrically conductive traces and inter-layer connections. The inter-layer connections are formed through conductive substrate vias, which are metalized through-holes extending between conductive layers in one embodiment.

Substrate 250 includes IC 260 which includes amplification circuitry to boost the current and/or voltage of the signal received from DUT 130. In one embodiment, IC 260 may be removably attached to substrate 250. IC 260 is in electrical communication with a testing apparatus or external components through substrate 250 and probe card 220 of device tester 120. IC 260 is in electrical communication with DUT 130 through substrate 250 to transmit stimulus to DUT 130 and receive responses to the stimulus from DUT 130.

In some chip configurations, the responses to the stimulus may have a relatively low signal strength, especially if DUT 130 is designed to have limited or nonexistent (high-speed) I/O functionality. For example, DUT 130 may be a core die with mini-buffers designed to communicate with nearby dies or components that are a short distance away. The core die may be a die designed for a stacked packaging configuration where the mini-buffers couple to through silicon vias and micro bumps. This configuration may operate at power levels at less than 10 milliamps and less than 0.7 volts. Such low power signals may be too weak to travel through the probe card to the testing apparatus for evaluation. IC 260 is equipped with active circuit components, such as a voltage level shifter, operable to amplify low power signals. IC 260 includes a voltage level shifter operable to amplify buffered, weak signals in one embodiment so that the signal can be processed by the testing apparatus.

Power to IC 260 may be supplied by the testing apparatus or another suitable external power supply.

Signal probe 270 is a high-frequency electrode coupled to the surface of the substrate 250 and solder bump 290 of DUT 130. It should be appreciated that signal probe 270 and power probe 280 may be any suitable probes currently utilized on probe cards. It should be further appreciated that on-wafer electrical testing requires probing of electrical contacts located on DUT 130. Electro-mechanical contact is made by temporarily exerting pressure between signal probe 270, power probe 280, and conductive solder bumps 290 or wire bonds disposed on the top surface of the DUT 130. Device tester 120 may include one or more decoupling capacitors 240 mounted on a surface of the probe card. Alternatively, decoupling capacitor 240 may be mounted in proximity to signal probe 270 on substrate 250. Decoupling capacitor 240 functions as a filter to suppress unwanted high-frequency noise travelling along the electrical path during electrical testing. As the distance between decoupling capacitor 240 and DUT 130 is increased, filtering efficiency decreases due to unwanted inductance associated with physical geometry. Therefore, keeping the distance between decoupling capacitor 240 and DUT 130 as short as practicable reduces unwanted inductance and allows for relatively high testing speeds.

Figure 3:
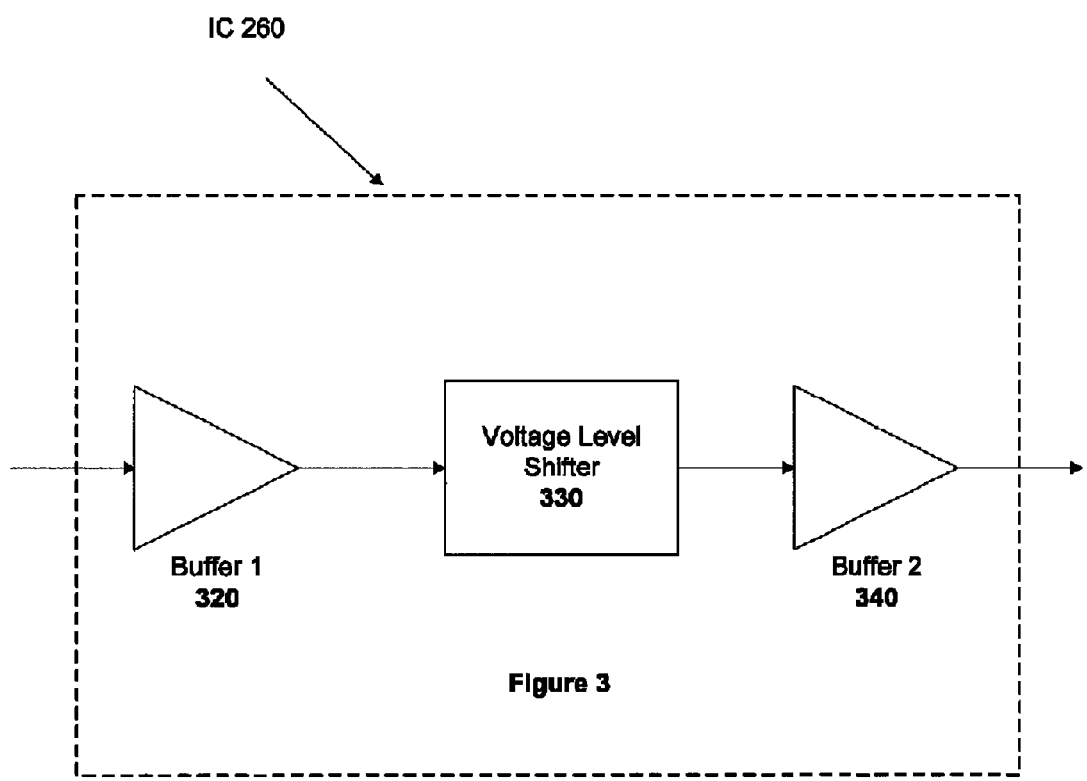
FIG. 3 is a schematic diagram of a voltage level shifter circuit according to one embodiment.

FIG. 3 is a schematic diagram of a voltage level shifter circuit according to one embodiment. Voltage level shifter 330 of IC 260 provides an interface between DUT 130 and an external testing apparatus where the current and/or voltage of a signal can be amplified. As mentioned above, IC 260 may be coupled to an external power supply, such as the testing apparatus. IC 260 includes an input buffer 320 that is electrically coupled to voltage level shifter 330. Voltage level shifter 330 is electrically coupled to a second buffer 340. First buffer 320 and second buffer 340 may be unity gain buffer circuits having high input impedance and low output impedance. First buffer 320 has a smaller voltage capacity than second buffer 340 in one embodiment. First buffer 320 transfers the pattern of low level test signals from to voltage level shifter 330. Voltage level shifter 330 may comprise a high-speed gain amplifier or multi-stage amplifiers operable to convert a received input voltage into an output voltage having a different level than the input voltage in one embodiment. In another embodiment the output of voltage level shifter 330 changes by an amount proportional to the low level input voltage signal. In another embodiment the voltage level shifter 330 is operable to transform the received low voltage to a range of high output voltages. Voltage level shifter 330 may further include noise-suppression circuitry or protection circuitry arranged to prevent overdrive conditions and instability in one embodiment.

Figure 4:
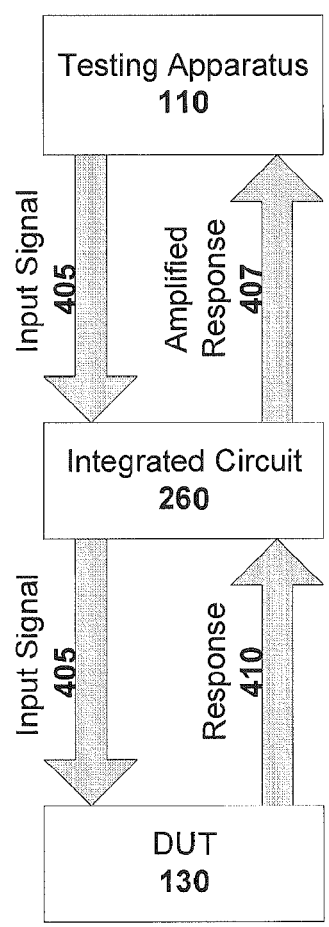
FIG. 4 is a schematic diagram illustrating a method for testing a device under test according to one embodiment.

FIG. 4 is a schematic diagram illustrating a method for testing a DUT in according to one embodiment. Integrated circuit 260 receives a low power input signal 405 from a testing apparatus 110, which is then transmitted from IC 260 to DUT 130. Input signal 405 may be a series of testing signals that DUT 130 receives from external testing apparatus 110 in one embodiment. DUT 130 is stimulated to send a response signal 410 that is received and amplified by integrated circuit 260. In one embodiment, the response signal 410 is amplified in response to IC 260 detecting that the response signal 410 is weak. For example, IC 260 may include a comparator (not shown) for comparing the signal strength of the response signal 410 to a minimum threshold value, which may be user adjustable, to determine whether the response signal 410 needs to be amplified. Response signal 410 may have to travel through a micro bump interconnection before the signal is received by integrated circuit 260 in one embodiment. Integrated circuit 260 transmits the amplified response 407 to testing apparatus 110. In one embodiment, the signal is amplified from a voltage of less than about 0.7 volts and a current of less than about 2 milliamps to a voltage of about 3.3 volts and a current of about 10-16 milliamps.

The method and apparatus described herein may be incorporated into any suitable circuit, including processors, application specific integrated circuits (ASIC) and programmable logic devices (PLDs). The PLDs can include programmable array logic (PAL), programmable logic arrays (PLAs), field programmable logic array (FPLAs), electrically programmable logic devices (EPLDs), electrically erasable programmable logic devices (EEPLDs), logic cell arrays (LCAs), field programmable gate arrays (FPGAs), application specific standard products (ASSPs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by the assignee.

The embodiments may be practiced with other computer system configurations including hand-held devices, microprocessor systems, microprocessor-based or programmable consumer electronics, minicomputers, mainframe computers and the like. The embodiments may also be practiced in distributed computing environments where tasks are performed by remote processing devices that are linked through a network.

With the above embodiments in mind, it should be understood that the embodiments may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing embodiments have been described in some detail for purposes of clarity of understanding, it will be apparent that certain changes and modifications can be practiced within the scope of the appended claims. Accordingly, the embodiments are to be considered as illustrative and not restrictive, and the embodiments are not to be limited to the details given herein, but may be modified within the scope and equivalents of the appended claims.

What is claimed is:

1. A device tester comprising:
a substrate coupled to the probe card, wherein the substrate comprises a plurality of layers for routing a signal; and
an integrated circuit coupled to the substrate, wherein the integrated circuit receives an input signal from a testing apparatus, and wherein said integrated circuit transmits the received input signal to a device under test via signal probe of said substrate, wherein the signal probe receives a test signal from the device under test in response to transmission of the input signal to said device under test, wherein the integrated circuit amplifies the test signal and transmits the amplified test signal to the testing apparatus, wherein the integrated circuit comprises a voltage level shifting circuit, with a unity gain first buffer configured to transfer a unity gain, non-level-translated version of the test signal into the voltage level shifting circuit.

2. The device tester of claim 1, further comprising a probe card coupled to the substrate, wherein the probe card comprises a plurality of electrically conductive paths.

3. The device tester of claim 1, wherein the device under test transmits the test signal through micro bumps disposed on a surface of the device under test.

4. The device tester of claim 2, wherein the probe card is coupled to a power probe operable to provide power to the device under test.

5. The device tester of claim 1, wherein the amplification is in response to comparing a level of the test signal to a minimum threshold value.

6. The device tester of claim 1, wherein the voltage level shifting circuit includes the unity gain first buffer that receives the test signal and a second buffer that transmits the amplified test signal from the voltage level circuit to the testing apparatus.

7. The device tester of claim 6, wherein the unity gain first buffer has a smaller voltage capacity than the second buffer.

8. A device tester comprising:
an integrated circuit disposed on a multi-layer semiconductor substrate, the integrated circuit electrically coupled to a testing apparatus and a device under test, the integrated circuit configured to propagate electrical signals between the testing apparatus and the device under test, wherein the integrated circuit amplifies a voltage level of a response received from the device under test, the integrated circuit including a first unity gain buffer configured to receive the voltage level of the response from the device under test, the integrated circuit including a voltage level shifting circuit configured to receive an output of the first unity gain buffer and configured to amplify the voltage level of the response from the device under test, wherein the response generated by the device under test is based on a test signal transmitted to the device under test, and wherein said response is transmitted to the testing apparatus through the integrated circuit.

9. The device tester of claim 8 comprising a signal probe that transmits the test signal from the integrated circuit to the device under test.

10. The device tester of claim 9, wherein the signal probe couples to micro bumps of the device under test.

11. The device tester of claim 8 comprising a power probe coupled to the substrate and configured to provide power to the device under test.

12. The device tester of claim 8, wherein the substrate comprises a plurality of electrically conductive paths.

13. The device tester of claim 8, further comprising a probe card, wherein the probe card further comprises a decoupling capacitor.

14. The device tester of claim 8, wherein the voltage level shifting circuit includes a second buffer that transmits the amplified voltage level response.

15. The device tester of claim 14, wherein the first unity gain buffer has a voltage capacity that is less than a voltage capacity of the second buffer.

16. A method for testing a device under test, the method comprising:
receiving an input signal from a testing apparatus;
transmitting the input signal to a device under test through an integrated circuit, the integrated circuit included on a substrate coupled to a probe card;
in response to said transmitting, receiving a response from the device under test;
buffering the response from the device under test through a unity gain buffer;
level shifting an output of the unity gain buffer;
amplifying a voltage level of the level-shifted response through amplification circuitry of the integrated circuit in response to comparing the voltage level of the response to a minimum voltage level; and
transmitting the amplified response to the testing apparatus.

17. The method as in claim 16 further comprising receiving the response from the device under test through a micro bump interconnection.

* * * * *